(12) United States Patent
Kawaguchi et al.

(10) Patent No.: US 8,008,715 B2
(45) Date of Patent: Aug. 30, 2011

(54) SEMICONDUCTOR DEVICE (75) Inventors: Yusuke Kawaguchi, Kanagawa-ken (JP); Kazuya Nakayama, Kanagawa-ken (JP); Tsuyoshi Ohta, Kanagawa-ken (JP); Takeshi Uchihara, Saitama-ken (JP); Takahiro Kawano, Kanagawa-ken (JP); Yuji Kato, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 365 days.

(21) Appl. No.: 12/185,630

(22) Filed: Aug. 4, 2008

(65) Prior Publication Data
US 2009/0032875 A1 Feb. 5, 2009

(30) Foreign Application Priority Data

Aug. 3, 2007 (JP) ................................. 2007-203595

(51) Int. Cl.
*H01L 29/78* (2006.01)
(52) U.S. Cl. ................................. 257/331; 257/E29.262
(58) Field of Classification Search .................. 257/331, 257/355, E29.262, 378
See application file for complete search history.

(56) References Cited

U.S. PATENT DOCUMENTS

| | | | | |
|---|---|---|---|---|
| 4,571,513 A * | 2/1986 | Lade et al. | ...................... | 327/389 |
| 6,180,966 B1 * | 1/2001 | Kohno et al. | .................. | 257/173 |
| 7,319,257 B2 * | 1/2008 | Yamaguchi et al. | .......... | 257/331 |
| 7,462,908 B2 * | 12/2008 | Bol et al. | ....................... | 257/328 |
| 7,485,921 B2 * | 2/2009 | Kawaguchi et al. | ........... | 257/331 |
| 7,541,642 B2 * | 6/2009 | Kawamura et al. | ........... | 257/331 |
| 2002/0130359 A1 * | 9/2002 | Okumura et al. | .............. | 257/330 |
| 2005/0199953 A1 * | 9/2005 | Kawamura et al. | ........... | 257/341 |
| 2006/0267085 A1 * | 11/2006 | Matsuura | ........................ | 257/330 |
| 2008/0211017 A1 * | 9/2008 | Mizokuchi et al. | ........... | 257/331 |
| 2009/0302379 A1 * | 12/2009 | Takaishi | ......................... | 257/330 |

FOREIGN PATENT DOCUMENTS

| | | |
|---|---|---|
| JP | 2001-024193 | 1/2001 |
| JP | 2007-115888 | 5/2007 |

* cited by examiner

*Primary Examiner* — Allan R Wilson
(74) *Attorney, Agent, or Firm* — Oblon, Spivak, McClelland, Maier & Neustadt, L.L.P.

(57) ABSTRACT

There is provided a semiconductor device comprising: a first semiconductor layer of a first conductivity type; a second semiconductor layer of a second conductivity type provided on the first semiconductor layer of the first conductivity type; a semiconductor region of the first conductivity type selectively provided on a front surface portion of the second semiconductor layer of the second conductivity type; a first main electrode provided in contact with a surface of the semiconductor region; a second main electrode provided on a side of the first semiconductor layer of the first conductivity type, the side being opposite to the surface on which the second semiconductor layer of the second conductivity type is provided; a gate wiring provided on the second semiconductor layer of the second conductivity type around an element region in which the semiconductor region is provided; a trench penetrating the second semiconductor layer of the second conductivity type to reach the first semiconductor layer of the first conductivity type, and also extending under the element region and the gate wiring; a gate electrode provided inside the trench in the element region with a gate insulating film interposed in between; and a gate electrode lead portion provided inside the trench under the gate wiring with the gate insulating film interposed in between, and contacting the gate wiring and the gate electrode.

17 Claims, 8 Drawing Sheets

SEMICONDUCTOR DEVICE

CROSS-REFERENCE TO RELATED APPLICATIONS

This application is based upon and claims the benefit of priority from the prior Japanese Patent Application No. 2007-203595, filed on Aug. 3, 2007; the entire contents of which are incorporated herein by reference.

BACKGROUND OF THE INVENTION

The present invention relates to a semiconductor device, and particularly, relates to a semiconductor device having a gate wiring provided around an element region in which a main current path is formed.

In recent years, use of power MOSFETs (Metal-Oxide-Semiconductor Field Effect Transistors) has been rapidly increasing for switched mode power supplies having high breakdown voltage for high current, and for energy saving switches for mobile communications equipment including laptop personal computers. In such devices, the power MOSFETs are used in power management circuits, safety circuits in lithium ion batteries, and the like. For power MOSFETS used in such applications, low voltage drive and low on resistance are demanded, so that the power MOSFETs are used with the voltage of a cell. At the same time, high resistance against breakdown from electrostatic charge applied during assembling is also demanded. A trench gate type structure is known as an example of the power MOSFETs (see, for example, Japanese Patent Application Publication NO. 2007-115888).

SUMMARY OF THE INVENTION

According to an aspect of the invention, there is provided a semiconductor device comprising: a first semiconductor layer of a first conductivity type; a second semiconductor layer of a second conductivity type provided on the first semiconductor layer of the first conductivity type; a semiconductor region of the first conductivity type selectively provided on a front surface portion of the second semiconductor layer of the second conductivity type; a first main electrode provided in contact with a surface of the semiconductor region; a second main electrode provided on a side of the first semiconductor layer of the first conductivity type, the side being opposite to the surface on which the second semiconductor layer of the second conductivity type is provided; a gate wiring provided on the second semiconductor layer of the second conductivity type around an element region in which the semiconductor region is provided; a trench penetrating the second semiconductor layer of the second conductivity type to reach the first semiconductor layer of the first conductivity type, and also extending under the element region and the gate wiring; a gate electrode provided inside the trench in the element region with a gate insulating film interposed in between; and a gate electrode lead portion provided inside the trench under the gate wiring with the gate insulating film interposed in between, and contacting the gate wiring and the gate electrode.

According to another aspect of the invention, there is provided a semiconductor device comprising: a first semiconductor layer of a first conductivity type; a second semiconductor layer of a second conductivity type provided on the first semiconductor layer of the first conductivity type; a semiconductor region of the first conductivity type selectively provided on a front surface portion of the second semiconductor layer of the second conductivity type; a first main electrode provided in contact with a surface of the semiconductor region; a second main electrode provided on a side of the first semiconductor layer of the first conductivity type, the side being opposite to a surface on which the second semiconductor layer of the second conductivity type is provided; a gate wiring provided on the second semiconductor layer of the second conductivity type around an element region in which the semiconductor region is provided; a plurality of trenches each penetrating the second semiconductor layer of the second conductivity type to reach the first semiconductor layer of the first conductivity type, and also extending under the element region and the gate wiring; a plurality of gate electrodes provided inside each trench in the element region with a gate insulating film interposed in between; and a gate electrode lead portion provided inside each trench under the gate wiring with the gate insulating film interposed in between and contacting the gate wiring and the plurality of gate electrodes.

DETAILED DESCRIPTION OF THE INVENTION

Hereinafter, with reference to the drawings, an embodiment according to the present invention will be described. In the embodiment below, a vertical power MOSFET (Metal-Oxide-Semiconductor Field Effect Transistor) is used as an example of a semiconductor device for description. In the embodiment below, a first conductivity type is defined as an n type and a second conductivity type is defined as a p type in description.

Figure 1:
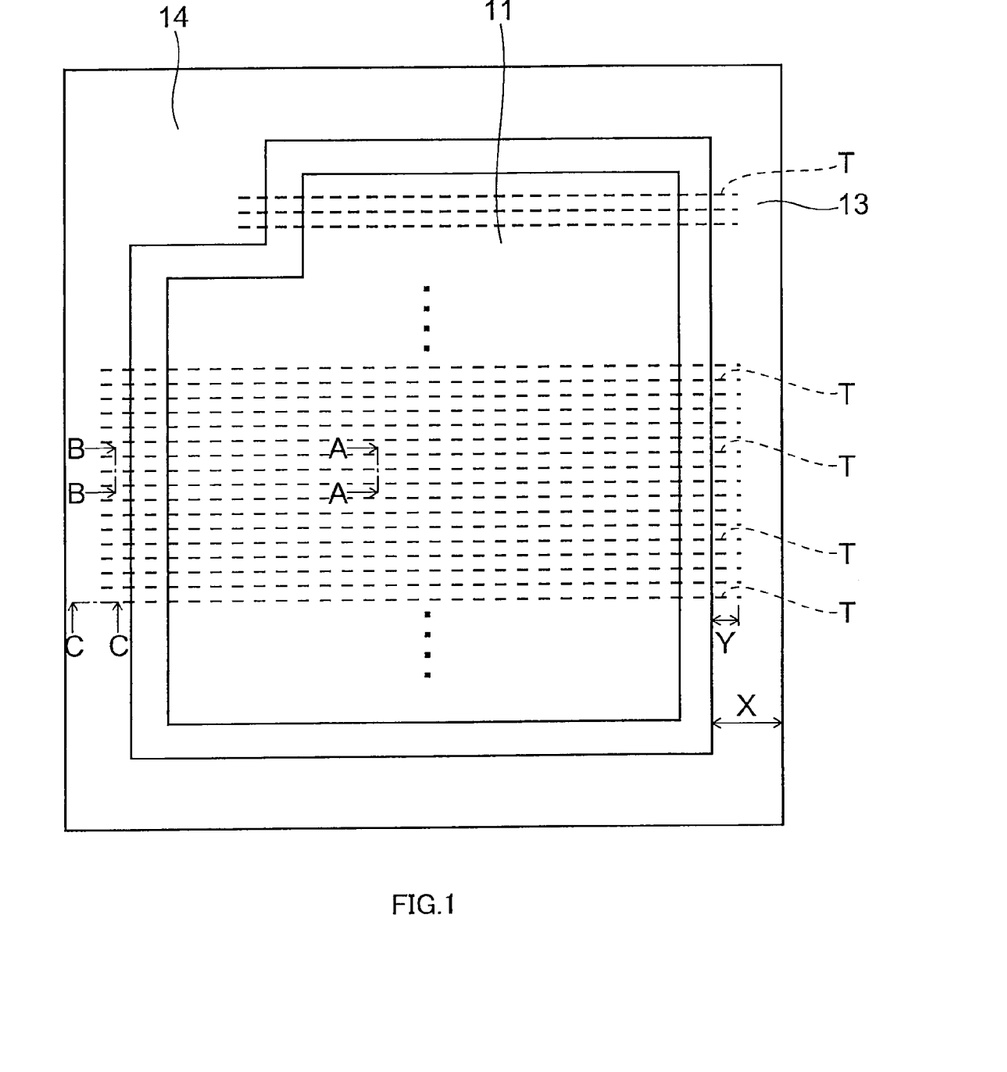
FIG. 1 is a schematic view showing an example of an element region, a gate wiring provided around the element region, and a planar pattern of a trench that extends under the element region and the gate wiring in a semiconductor device according to an embodiment of the present invention.

FIG. 1 is a schematic view showing an example of an element region, a gate wiring 13 provided around the element region, and a planar pattern of a trench that extends under the element region and the gate wiring 13 in a semiconductor device according to an embodiment of the present invention.

Figure 2:
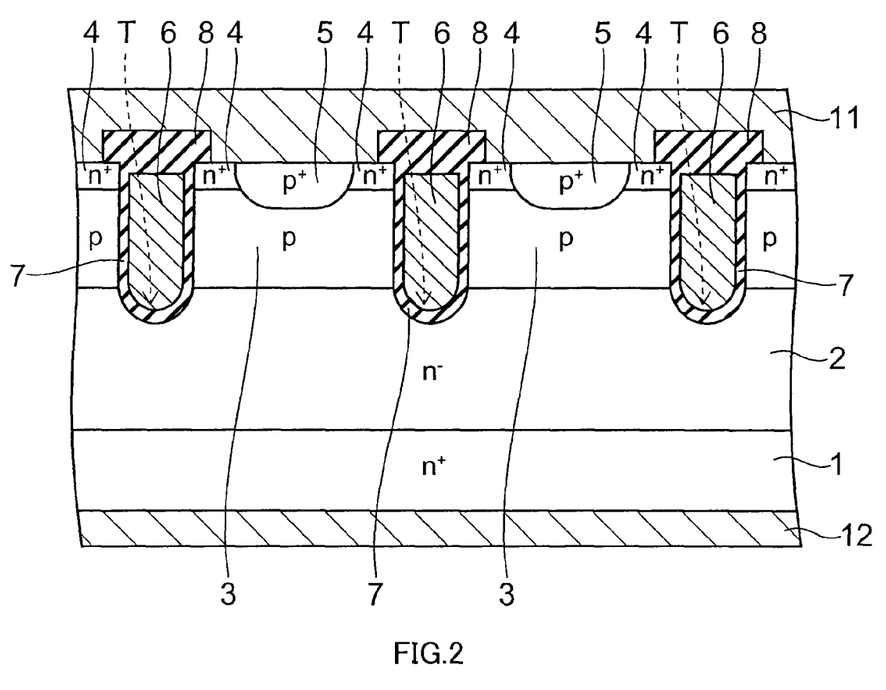
FIG. 2 is a sectional view taken along a line A-A in FIG. 1.
Figure 3:
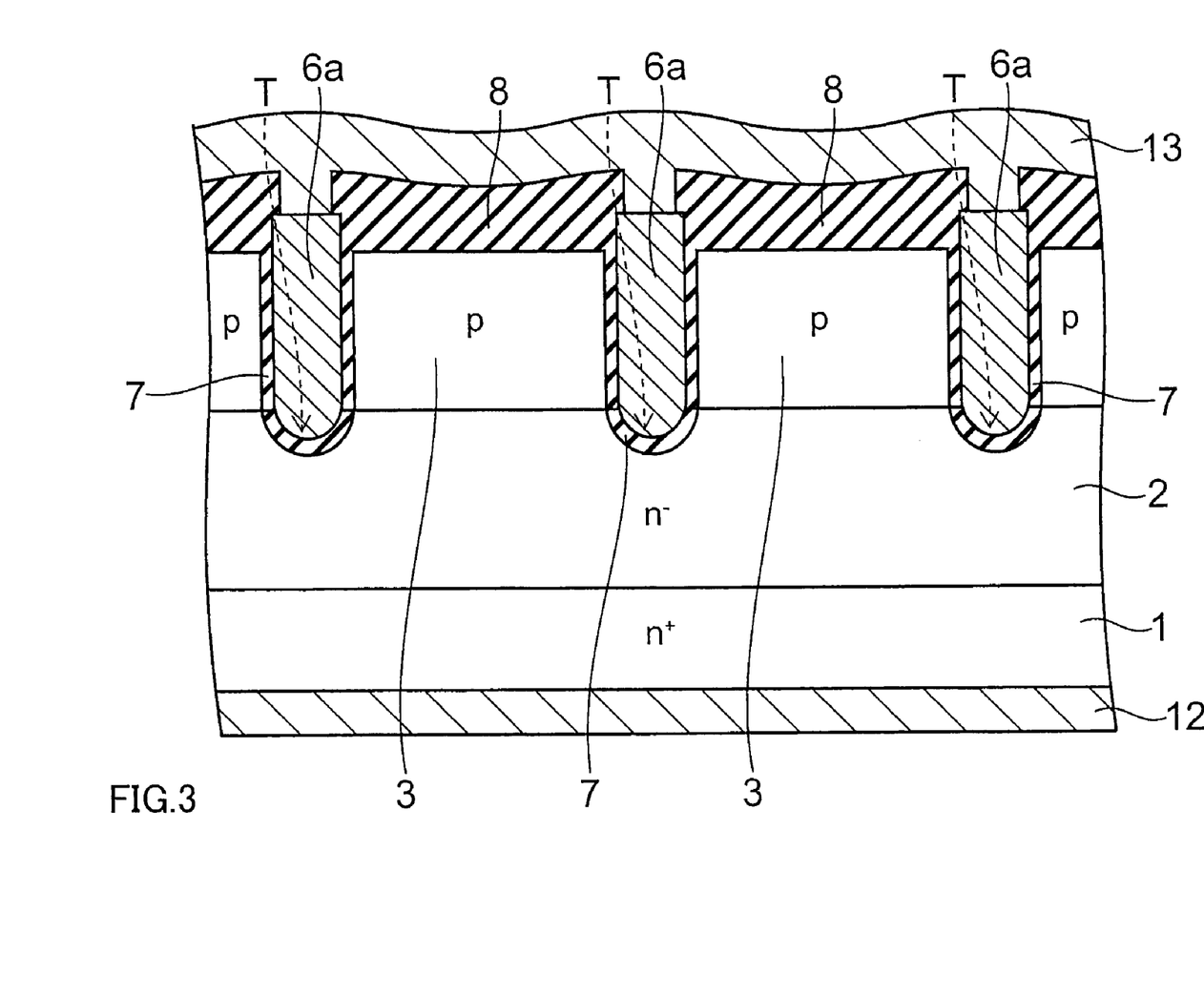
FIG. 3 is a sectional view taken along a line B-B in FIG. 1.
Figure 4:
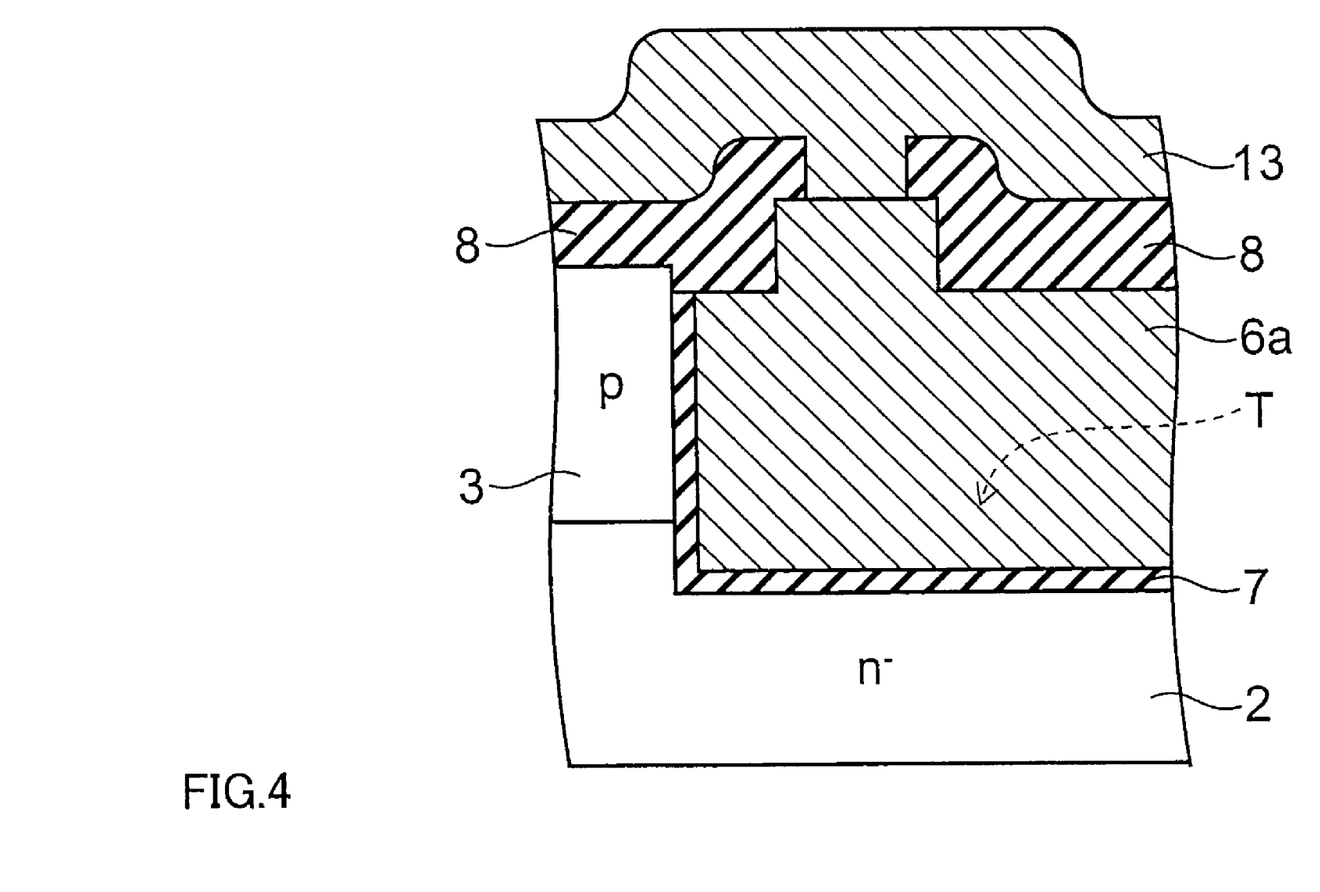
FIG. 4 is a sectional view taken along a line C-C in FIG. 1.

FIG. 2 is a sectional view taken along a line A-A in FIG. 1.
FIG. 3 is a sectional view taken along a line B-B in FIG. 1.
FIG. 4 is a sectional view taken along a line C-C in FIG. 1.

The semiconductor device according to the present embodiment is a vertical semiconductor device in which a main current path is formed in a vertical direction, connecting a first main electrode and a second main electrode provided respectively on a front surface and a rear surface of a semiconductor layer.

FIG. 2 shows a cross section in an element region (region through which main current flows). A drift layer 2 that is an epitaxial growth layer formed of n− type silicon is provided on a main surface of a substrate 1 formed of n+ type silicon with high impurity concentration (low resistance). On the drift layer 2 (front surface portion of the drift layer 2), a base layer 3 formed of a p type silicon is provided. On a surface of the base layer 3, a source region 4 formed of n+ type silicon and a base contact region 5 formed of p+ type silicon are selectively provided.

A plurality of trenches T are formed in a portion from a surface of the source region 4 to the drift layer 2 through the base layer 3. The source region 4 and the base layer 3 are adjacent to side surfaces of the trench T. The plurality of trenches T are provided to be aligned in striped pattern at an approximately equal pitch, as shown in FIG. 1.

A gate insulating film 7 made of, for example, silicon oxide film is formed on the side and bottom surfaces of the trench T. A gate electrode 6 including, for example, polycrystalline silicon is embedded inside the trench T with the gate insulating film 7 interposed in between.

On the front surfaces of the source region 4 and the base contact region 5, a source electrode 11 as a first main electrode is provided. The front surfaces of the source region 4 and the base contact region 5 are in contact with the source electrode 11. Thereby, the source region 4 is electrically connected with the source electrode 11, and the electrical potential of the base layer 3 is fixed to the electrical potential of the source electrode 11 through the base contact region 5. The source electrode 11 and the gate electrode 6 are electrically insulated by an interlayer insulating film 8 provided on the gate electrode 6. A drain electrode 12 as a second main electrode is provided on a surface opposite to the main surface of the substrate 1.

The base layer 3, the source region 4, and the base contact region 5 have a planar pattern, for example, in stripes extending in the same direction as the trench T.

When a predetermined gate voltage is applied to the gate electrode 6, a channel is formed in a portion of the base layer 3 facing the gate electrode 6 through gate insulating film 7. Then, through the source region 4, the channel, the drift layer 2, and the substrate 1 (drain layer), the main current path is formed between the source electrode 11 and the drain electrode 12, thus these two electrodes 11 and 12 are conducted.

In the present embodiment, an element region is defined as a region which the source region 4 is formed, and as mentioned above, application of the predetermined voltage to the gate electrode 6 causes the main current to flow in the vertical direction between the source electrode 11 and the drain electrode 12.

A gate wiring 13 and a gate pad 14 (with reference to FIG. 1) are provided in a region around the element region surrounding the element region. The gate pad 14 is connected to an external circuit, for example, by bonding wire.

The gate wiring 13 and the gate pad 14 include a metal integrally formed. FIG. 3 shows the cross section of a portion under the gate wiring 13. The drift layer 2 and the base layer 3 are also sequentially provided on the substrate 1 under the gate wiring 13. The gate wiring 13 is provided on the base layer 3 through the interlayer insulating film 8 formed of, for example, silicon oxide. The source region 4 is not formed under the gate wiring 13, and accordingly, the main current path in the vertical direction is not formed under the gate wiring 13.

The source electrode 11 that contacts the front surface of the source region 4 is formed in the element region. As shown in FIG. 1, the source electrode 11 does not overlap the gate wiring 13 and the gate pad 14, and an unillustrated interlayer insulating film is provided between the source electrode 11 and the gate wiring 13 and between the source electrode 11 and the gate pad 14. While a metal such as aluminum is used for the gate wiring 13, the gate pad 14, and the source electrode 11, a metal such as nickel is used for the drain electrode 12.

The trench T extends not only under of the element region but also under the gate wiring 13, as shown in FIG. 1. A gate electrode lead portion 6a formed of the same material (for example, polycrystalline silicon) as the gate electrode 6 in the element region is provided inside of the trench T under the gate wiring 13. The gate electrode 6 and the gate electrode lead portion 6a are integrally formed in a same process, and are electrically connected to each other.

As shown in FIGS. 3 and 4, the gate electrode lead portion 6a is in contact with the gate wiring 13 under the gate wiring 13. Specifically, the interlayer insulating film 8 provided on the gate electrode lead portion 6a has an opening opened selectively in portions under the gate wiring 13. The gate wiring 13 contacts an upper end of the gate electrode lead portion 6a through the opening so that the gate wiring 13 and the gate electrode lead portion 6a are electrically connected.

Figure 5:
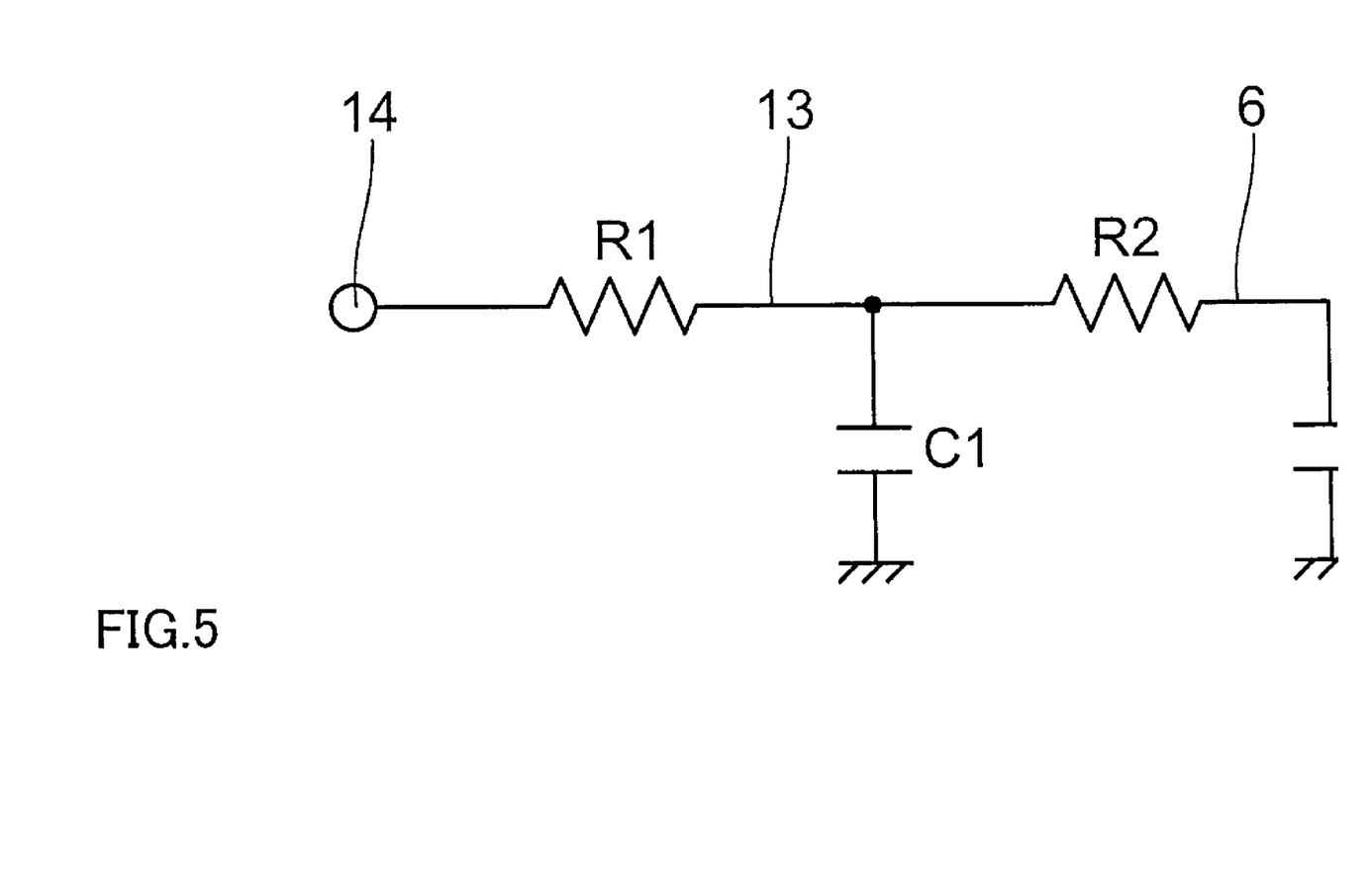
FIG. 5 is an equivalent circuit diagram showing a connecting relationship among a gate pad, the gate wiring, a gate electrode lead portion, and a gate electrode of the element region.

The gate electrode 6 in the element region is connected to the gate pad 14 through the gate wiring 13 provided around the element region, as shown equivalent circuit of FIG. 5. From a viewpoint of lowering the resistance, a metal may be used for the gate electrode 6 in the same manner as the cases of the gate wiring 13 and the gate pad 14. However, the gate electrode 6 is embedded within a fine trench T in a trench gate structure. Considering embedding nature during the formation, a semiconductor (for example, polycrystalline silicon) having fluidity superior to that of the metal is desirably used.

A resistance R2 of the gate electrode 6 in the element region is larger than a resistance R1 of the gate wiring 13 around the element region. When surge voltage of ESD (Electro Static Discharge) is applied between the gate and the source, a current flowing into a gate capacitance C2 (capacitance between the gate and the source) in the element region is limited by the resistance R2 of the gate electrode 6 in the element region. Therefore, a voltage (voltage of gate wiring 13) applied to a gate capacitance C1 (capacitance between the gate and the source) of the gate wiring 13 becomes higher than a voltage (voltage of the gate electrode 6) applied to the gate capacitance C2 in the element region. For this reason, a smaller capacitance of the gate capacitance C1 of the gate wiring 13 leads to a larger voltage applied to the gate capacitance C1 of the gate wiring 13, and the gate capacitance C1 exceeding tolerance might destroy the element. Therefore, it is desirable for the capacitance C1 of the gate wiring 13 to have a larger capacitance. The capacitance C1 of the gate wiring 13 is a sum of a capacitance corresponding to an area of the gate wiring 13 and a capacitance corresponding to an area of a portion where the gate electrode lead portion 6a faces the drift layer 2 and the base layer 3 with the gate insulating film 7 interposed in between under the gate wiring 13. That is, the capacitance C1 under the gate wiring can be increased by increasing the area of the gate wiring 13, or increasing the area of the portion where the gate electrode lead portion 6a faces the drift layer 2 and the base layer 3 with the gate insulating film 7 interposed in between.

In Japanese Patent Application Publication NO. 2007-115888, a structure wherein the gate wiring is also formed in the element region has been disclosed. When the area of the gate wiring is increased by forming the gate wiring also in the element region, the gate capacitance C1 of the gate wiring can be increased. However, in this case, a region in which the main current path is formed decreases, resulting in increase of on resistance.

On the other hand, in the present embodiment, as mentioned above, the trench T is also extended under the gate wiring 13, and the gate electrode lead portion 6a is provided within the trench T.

In other words, a trench gate structure electrically connected with the gate wiring 13 is also provided under the gate wiring 13. Thereby, an area of a portion where the gate electrode lead portion 6a faces the drift layer 2 and the base layer 3 with the gate insulating film 7 interposed in between can be increased. Moreover, the gate capacitance C1 of the gate wiring 13 for a frequency component of the ESD surge can be increased, and larger ESD resistance can be obtained. In addition, since the gate capacitance is increased using a portion under the gate wiring 13 which is around the element region and having no main current path formed originally, increase of the on resistance due to reduction of the main current path in the element region can be avoided.

In the present embodiment, as shown in FIG. 4, a portion of the gate electrode lead portion 6a contacting the gate wiring 13 projects upwards compared to other portion. Thereby, thickness of the gate electrode lead portion 6a in the vertical direction (thickness of the base layer 3 in a thickness direction) becomes larger by the projection than other portion including the gate electrode 6 in the element region. Therefore, the gate capacitance of the gate wiring 13 can be increased by the thickness so that the ESD resistance is effectively improved.

Such a structure can be obtained in the following manner. After forming the trench T, a semiconducting material such as polycrystalline silicon is embedded into the trench T. The semiconducting material is deposited beyond the opening end of the trench T. Then, a mask is formed only in a portion where a contact to the gate wiring 13 is provided. Etching is performed to selectively remove the semiconducting material.

Figure 6:
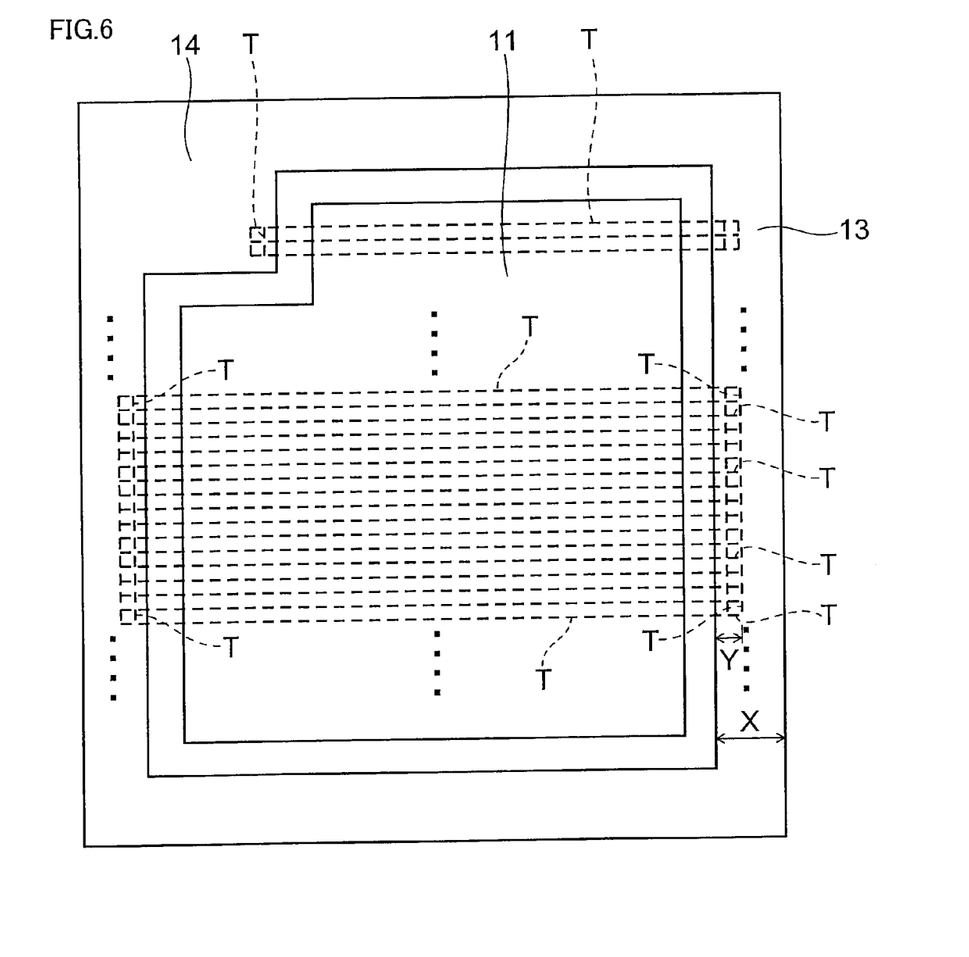
FIG. 6 is a schematic view showing another example of the planar pattern of the trench under the gate wiring in the semiconductor device according to the embodiment of the present invention.
Figure 7:
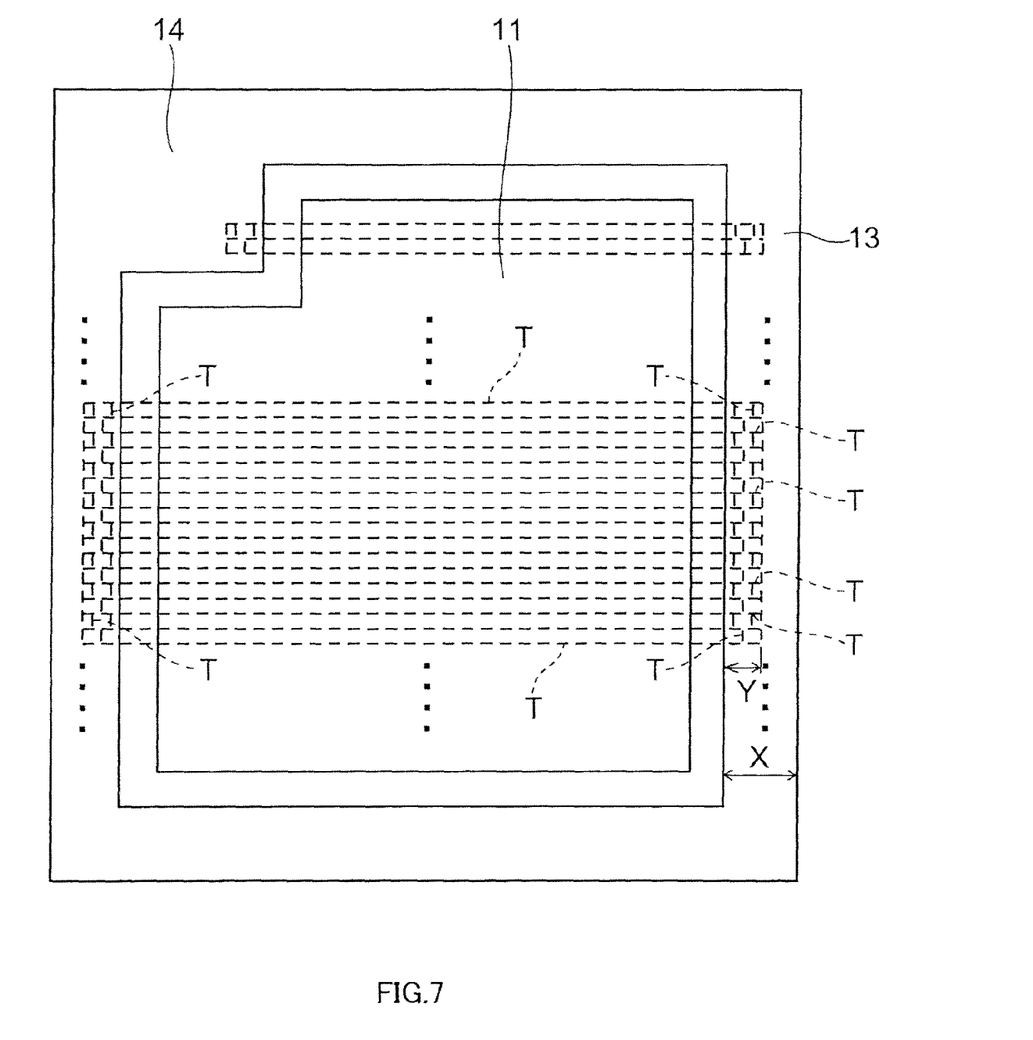
FIG. 7 is a schematic view showing further another example of the planar pattern of the trench under the gate wiring in the semiconductor device according to the embodiment of the present invention.

In order to increase the gate capacitance in the gate wiring 13, for example, the trench T under the gate wiring 13 and the gate electrode lead portion 6a that fills the inside of the trench T may be arranged in a mesh pattern as shown in FIGS. 6 and 7, desirably. Thereby, an area under the gate wiring 13 where the gate electrode lead portion 6a faces the drift layer 2 and the base layer 3 with the gate insulating film 7 interposed in between is made not less than an area in the element region where the gate electrode 6 having a stripe pattern faces the drift layer 2 and the base layer 3 with the gate insulating film 7 interposed in between, when compared in per unit area. The area where the gate electrode lead portion 6a faces the drift layer 2 and the base layer 3 with the gate insulating film 7 interposed in between increases when the volume of the gate electrode lead portion 6a increases. Thus, above mentioned configuration may also be described in such that, a distribution density of the gate electrode lead portion 6a per unit area under the gate wiring 13 is made not less than a distribution density of the gate electrode 6 having a stripe pattern per unit area in the element region. The mesh pattern here indicates a grid pattern formed, under the gate wiring 13, by the trench T and the gate electrode lead portion 6a in the extending direction of the gate electrode 6 having a stripe pattern and the direction perpendicular to the extending direction of the gate electrode 6. Alternatively, the mesh pattern here indicates a configuration under the gate wiring 13 where trench T and gate electrode lead portion 6a are formed of extending direction portion running in the stripe direction of the gate electrode 6 and a bridge portion acting as a bridge between the extending direction portions. Other than those, the trench T and the gate electrode lead portion 6a under the gate wiring 13 may form a honeycomb pattern where the above-mentioned adjacent bridge portions are alternately disposed (with offset).

Figure 8:
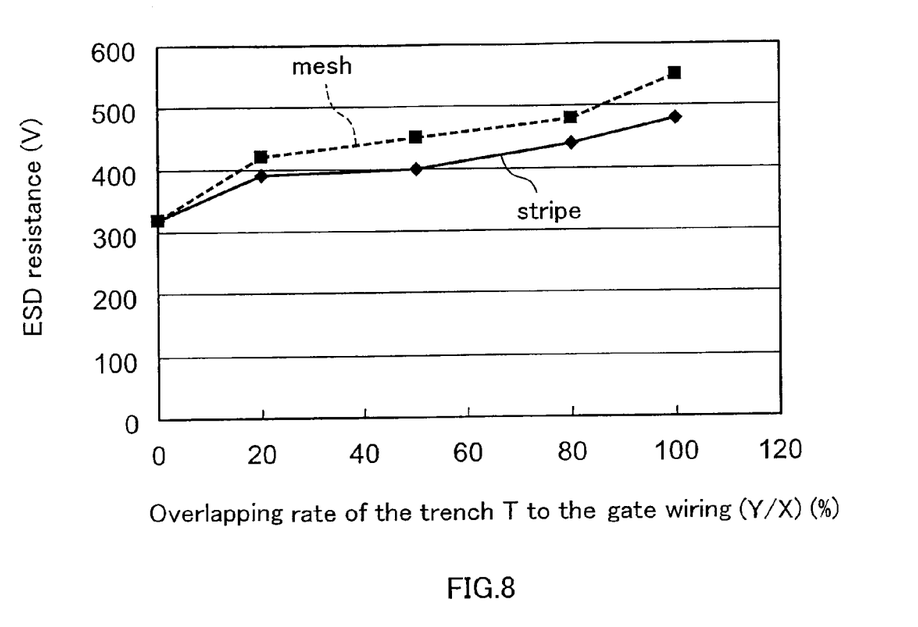
FIG. 8 is a graph showing a relationship between an overlapping rate of the trench (and the gate electrode lead portion inside thereof) to the gate wiring and an ESD resistance.

A graph of FIG. 8 shows results obtained by evaluating prototypes for a relationship between an overlapping rate of the trench T (and the gate electrode lead portion 6a within the trench T) to the gate wiring 13 and the ESD resistance.

An abscissa indicates the overlapping rate (Y/X) (%) of the trench T to the gate wiring 13 where X is a width of the gate wiring 13 and Y is a size of the gate wiring 13 in the trench T under the gate wiring 13 in a width direction. An ordinate indicates the ESD resistance (V) obtained by evaluating electrostatic-discharge destruction phenomenon which is an electric discharge taking place when a charged metal device touches a device terminal. Here, the trench (gate electrode lead portion) patterns used for evaluation of the prototypes are two patterns, i.e., the stripe pattern and the mesh pattern.

The results of FIG. 8 show that both in the mesh pattern and the stripe pattern, higher ESD resistance is obtained as the overlapping rate to the gate wiring becomes higher, and the highest ESD resistance is obtained when the overlapping rate is 100%, i.e., when the trench T overlaps all over the gate wiring 13 in the width direction. In addition, higher ESD resistance is obtained in the mesh pattern than in the stripe pattern. This is because the mesh pattern has a larger area under the gate wiring 13 where the gate electrode lead portion 6a faces the drift layer 2 and the base layer 3 with the gate insulating film 7 interposed in between than that of the stripe pattern, compared in per unit area. In other words, this is because the distribution density of the gate electrode lead portion 6a per unit area under the gate wiring 13 is larger in the mesh pattern than that of the stripe pattern.

Alternatively, a depth and a width in a transverse direction of the trench T and the gate electrode lead portion 6a under the gate wiring 13 may be set larger than those in the trench T and the gate electrode 6 in the element region so as to increase the area per unit area under the gate wiring 13 where the gate electrode lead portion 6a faces the drift layer 2 and the base layer 3 with the gate insulating film 7 interposed in between. Accordingly, the gate capacitance of the gate wiring 13 is increased. Desirably, the trenches T under the element region and the gate wiring 13 are formed in the same process in order to avoid increase in the number of processes. In that case, when forming the trenches T by etching using the mask, an opening of the mask under the gate wiring 13 is made larger than that in the element region. Thereby, the width of the trench T under the gate wiring 13 is made larger than that in the element region. Moreover, in the case, because of micro loading effect of dry etching, the portion under the gate wiring 13 with the larger opening of the mask can be etched deeper than the portion in the element region, thus the trench T under the gate wiring 13 has a depth larger than that of the trench T in the element region.

In the above, the embodiment of the present invention has been described with reference to the examples. However, the present invention is not limited to those examples and various modifications are possible based on technical ideas of the present invention.

In the above description of the embodiment, while the first conductivity type is defined as the n type and the second conductivity type is defined as the p type, the present invention can be practiced even when the first conductivity type is defined as the p type and the second conductivity type is defined as the n type.

The planar pattern of the trench gate structure in the element region, the base layer, and the source region is not limited to the stripe pattern, and may be of a grid pattern or a zigzag pattern. The present invention is not limited to the MOSFETs, and can be applied, for example, to IGBTs (Insulated Gate Bipolar Transistors) and the like. Furthermore, the embodiment mentioned above has been described when the insulating film is integrally formed inside of the trench in the element region and inside of the trench under the gate wiring in the same process. However, alternatively, it is also possible to form the insulating film inside of the trench in the element region and the insulating film inside of the trench under the gate wiring in separated processes, respectively.

The invention claimed is:

1. A semiconductor device comprising:
a first semiconductor layer of a first conductivity type;
a second semiconductor layer of a second conductivity type provided on the first semiconductor layer of the first conductivity type;
a semiconductor region of the first conductivity type selectively provided on a front surface portion of the second semiconductor layer of the second conductivity type;
a first main electrode provided in contact with a surface of the semiconductor region;
a second main electrode provided on a side of the first semiconductor layer of the first conductivity type, the side being opposite to the surface on which the second semiconductor layer of the second conductivity type is provided;
a gate wiring provided on the second semiconductor layer of the second conductivity type around an element region in which the semiconductor region is provided;
a trench penetrating the second semiconductor layer of the second conductivity type to reach the first semiconductor layer of the first conductivity type, and also extending under the element region and the gate wiring;
a gate electrode provided inside the trench in the element region with a gate insulating film interposed in between; and
a gate electrode lead portion provided inside the trench directly under the gate wiring with the gate insulating film interposed in between, and contacting the gate wiring and the gate electrode.

2. The semiconductor device according to claim 1, wherein a distribution density of the gate electrode lead portion per unit area under the gate wiring is not less than a distribution density of the gate electrode per unit area in the element region.

3. The semiconductor device according to claim 1, wherein a first area per unit area under the gate wiring is not less than a second area per unit area of the element region,
the first area being an area of a portion of the gate electrode lead portion, the portion facing the first semiconductor layer of the first conductivity type and the second semiconductor layer of the second conductivity type with the gate insulating film interposed in between,
the second area being an area of a portion of the gate electrode, the portion facing the first semiconductor layer of the first conductivity type and the second semiconductor layer of the second conductivity type with the gate insulating film interposed in between.

4. The semiconductor device according to claim 1, wherein the gate electrode lead portion under the gate wiring is formed in a mesh pattern.

5. The semiconductor device according to claim 1, wherein a portion of the gate electrode lead portion contacting the gate wiring is thicker than the gate electrode of the element region in a thickness direction of the second semiconductor layer.

6. The semiconductor device according to claim 1, wherein the gate electrode and the gate electrode lead portion contain polycrystalline silicon.

7. A semiconductor device comprising:
a first semiconductor layer of a first conductivity type;
a second semiconductor layer of a second conductivity type provided on the first semiconductor layer of the first conductivity type;
a semiconductor region of the first conductivity type selectively provided on a front surface portion of the second semiconductor layer of the second conductivity type;
a first main electrode provided in contact with a surface of the semiconductor region;
a second main electrode provided on a side of the first semiconductor layer of the first conductivity type, the side being opposite to a surface on which the second semiconductor layer of the second conductivity type is provided;
a gate wiring provided on the second semiconductor layer of the second conductivity type around an element region in which the semiconductor region is provided;
a plurality of trenches each penetrating the second semiconductor layer of the second conductivity type to reach the first semiconductor layer of the first conductivity type, and also extending under the element region and the gate wiring;
a plurality of gate electrodes provided inside each trench in the element region with a gate insulating film interposed in between; and
a gate electrode lead portion provided inside each trench directly under the gate wiring with the gate insulating film interposed in between and contacting the gate wiring and the plurality of gate electrodes.

8. The semiconductor device according to claim 7, wherein under the gate wiring, the gate electrode lead portion has a mesh pattern formed of a plurality of extending direction portions that extend in a stripe direction of the gate electrodes and a plurality of bridge portions that bridges between the plurality of extending direction portions adjacent to one another.

9. The semiconductor device according to claim 8, wherein a plurality of the adjacent bridge portions exist between the adjacent extending direction portions.

10. The semiconductor device according to claim 8, wherein the bridge portion extends in a direction perpendicular to the stripe direction of the gate electrode.

11. The semiconductor device according to claim 8, wherein the adjacent bridge portions on both sides of each extending direction portion are arranged with offset in the extending direction of the stripe so that the gate electrode lead portion is formed in a honeycomb pattern.

12. The semiconductor device according to claim 7, wherein the gate electrode and the gate electrode lead portion contain polycrystalline silicon.

13. The semiconductor device according to claim 12, wherein the gate wiring is made of a metallic material.

14. The semiconductor device according to claim 8, wherein the gate electrode and the gate electrode lead portion include polycrystalline silicon.

15. The semiconductor device according to claim 14, wherein the gate wiring is made of a metallic material.

16. The semiconductor device according to claim 8, wherein a distribution density of the gate electrode lead portion per unit area under the gate wiring is not less than a distribution density of the gate electrode per unit area in the element region.

17. The semiconductor device according to claim 8, wherein a first area per unit area under the gate wiring is not less than a second area per unit area of the element region,
the first area being an area of a portion where the gate electrode lead portion faces the first semiconductor layer of the first conductivity type and the second semiconductor layer of the second conductivity type with the gate insulating film interposed in between,
the second area being an area of a portion where the gate electrode faces the first semiconductor layer of the first conductivity type and the second semiconductor layer of the second conductivity type with the gate insulating film interposed in between.

* * * * *